US008462891B2

(12) United States Patent
Kizer et al.

(10) Patent No.: US 8,462,891 B2
(45) Date of Patent: Jun. 11, 2013

(54) ERROR DETECTION AND OFFSET CANCELLATION DURING MULTI-WIRE COMMUNICATION

(75) Inventors: Jade M. Kizer, Windsor, CO (US); John Wilson, Raleigh, NC (US); Lei Luo, Durham, NC (US); Frederick Ware, Los Altos Hills, CA (US); Jared L. Zerbe, Woodside, CA (US)

(73) Assignee: Rambus Inc., Sunnyvale, CA (US)

( * ) Notice: Subject to any disclaimer, the term of this patent is extended or adjusted under 35 U.S.C. 154(b) by 351 days.

(21) Appl. No.: 12/920,806

(22) PCT Filed: Feb. 19, 2009

(86) PCT No.: PCT/US2009/034494
§ 371 (c)(1),
(2), (4) Date: Sep. 2, 2010

(87) PCT Pub. No.: WO2009/111175
PCT Pub. Date: Sep. 11, 2009

(65) Prior Publication Data
US 2011/0051854 A1    Mar. 3, 2011

Related U.S. Application Data

(60) Provisional application No. 61/034,284, filed on Mar. 6, 2008.

(51) Int. Cl.
*H04L 27/06* (2006.01)
(52) U.S. Cl.
USPC ........... 375/340; 375/257; 375/264; 375/286; 375/288; 375/295; 375/316; 375/318; 341/55; 341/56; 341/143

(58) Field of Classification Search
USPC ............... 375/257, 264, 286, 288, 295, 316, 375/318, 340; 341/55, 56, 143
See application file for complete search history.

(56) References Cited

U.S. PATENT DOCUMENTS

| 6,044,412 A   | 3/2000 | Evoy ............................. 710/14 |
| 6,278,740 B1* | 8/2001 | Nordyke ...................... 375/257 |

(Continued)

FOREIGN PATENT DOCUMENTS

| EP | 0905631 A2 | 3/1999 |
| EP | 1890294    | 2/2008 |

OTHER PUBLICATIONS

J.J. O'Reilly A. Popplewell, "Class of Disparity Reducing Transmission Codes with Embedded Error Protection", IEEE Proceedings, vol. 137, No. 2, Apr. 1990, XP002527268.

(Continued)

*Primary Examiner* — Leon Flores
(74) *Attorney, Agent, or Firm* — Mahamedi Paradice Kreisman LLP; Lance M. Kreisman

(57) ABSTRACT

Embodiments of a circuit are described. In this circuit, a receive circuit includes M input nodes that receive a set of M symbols on M links during a time interval, where the set of M symbols are associated with a codeword. Moreover, the receive circuit includes a decoder, coupled to the M input nodes, that determines the codeword in a code space based on the set of M symbols and that decodes the codeword to a corresponding set of N decoded symbols. Additionally, the receive circuit may include a detector that detects an imbalance in a number of instances of a first value in the set of M symbols and a number of instances of a second value in the set of M symbols, and, if an imbalance is detected, that asserts an error condition.

22 Claims, 11 Drawing Sheets

U.S. PATENT DOCUMENTS

| | | | |
|---|---|---|---|
| 7,339,502 B2 * | 3/2008 | Furtner | 341/55 |
| 2002/0118593 A1 | 8/2002 | Takemae | 365/233 |
| 2004/0064599 A1 | 4/2004 | Jahnke et al. | 710/14 |
| 2004/0210715 A1 | 10/2004 | Harari et al. | 711/115 |
| 2007/0033336 A1 | 2/2007 | Oh | 711/104 |
| 2007/0186061 A1 | 8/2007 | Oh et al. | 711/154 |

OTHER PUBLICATIONS

Woopoung, Kim et al., "Study of Signal and Power Integrity Challenges in High-Speed Memory I/O Designs Using Single-Ended Signaling Schemes", Feb. 7, 2008, XP002527269.

Poulton, J.W., et al., "Multiwire Differential Signaling," Technical Paper, University of North Carolina-Chapel Hill, Department of Computer Science, Aug. 2003. 20 Pages.

Notification of Transmittal of the International Search Report and the Witten Opinion of the International Searching Authority with mail date Sep. 24, 2009 re PCT/US2009/050590. 13 pages.

International Preliminary Report on Patentability (Chapter I) with mail date of Sep. 16, 2010 re Int'l. Application No. PCT/US09/034494. 7 Pages.

* cited by examiner

ERROR DETECTION AND OFFSET CANCELLATION DURING MULTI-WIRE COMMUNICATION

TECHNICAL FIELD

The present embodiments relate to techniques for communicating information. More specifically, the present embodiments relate to circuits and methods for communicating information using multiple wires.

Figure 1A:
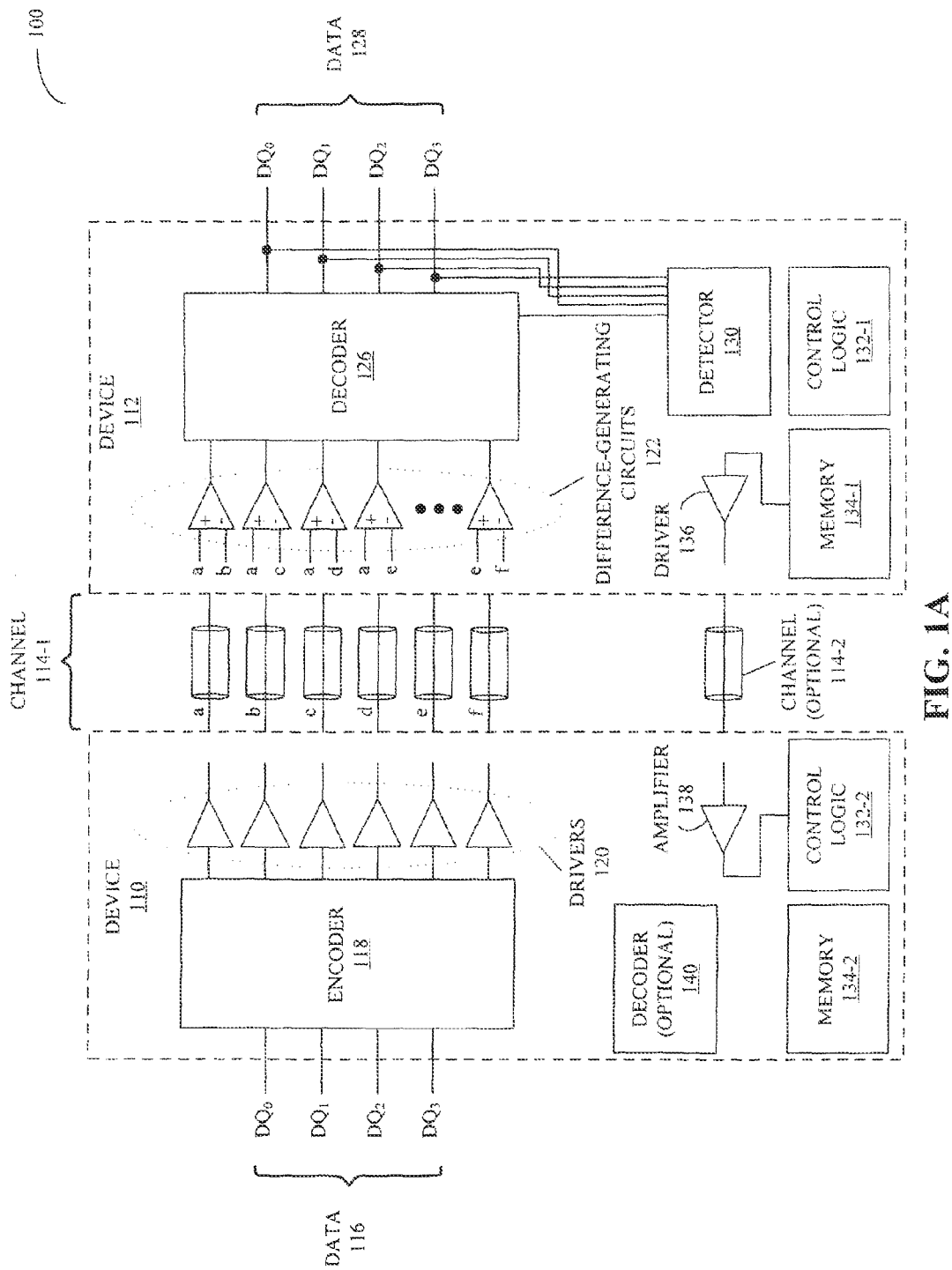
FIG. 1A is a block diagram illustrating an embodiment of a system.

Table 1 provides a coding table for use in multi-wire communication.

Note that like reference numerals refer to corresponding parts throughout the drawings.

DETAILED DESCRIPTION

Embodiments of one or more circuits, an integrated circuit that includes at least one of the one or more circuits, a memory device that includes at least one of the one or more circuits, a system that includes a transmitter (such as a memory controller) and a receiver (such as the memory device), and a technique for communicating data are described. This technique facilitates communication between devices or integrated circuits. In particular, multi-wire signaling in conjunction with the technique for communicating data is used to improve performance, for example, to initiate remedial action that reduces a bit-error rate during the communication. In some embodiments of the technique for communicating data, an offset voltage in one or more difference-generating circuits (such as a sampling circuit) in the receiver is determined and corrected.

FIG. 1A presents a block diagram illustrating an embodiment of a system 100, in which an encoder 118 in device 110 (such as a memory controller) encodes N data symbols $DQ_i$ in data 116 as a corresponding codeword having M symbols using an N-M encoding technique (which is discussed further below with reference to Table 1). Note that in general N is a positive number and M is a positive integer. Moreover, N may be less than M, and M may be less than 2N.

In some embodiments, the M symbols have binary values, including a first value (such as a logical '0') and a second value (such as a logical '1'). Moreover, in some embodiments the code implemented in the encoding technique is balanced, e.g., the codewords include equal numbers of the first value and the second value. In these embodiments, the use of a balanced code reduces or eliminates simultaneous switching noise if M is an even integer. More generally, simultaneous switching noise is reduced or eliminated if the number of the first value and the number of the second value are constant during a given time interval, such as a symbol time in the corresponding codeword.

After encoding, drivers 120 output the M symbols associated with the codeword onto M wires or links (such as links a through f) in channel 114-1. For example, during a given time interval (such as a symbol time) a given symbol may be output on a given link.

At device 112 (such as a memory device), at least M difference-generating circuits 122 receive the M symbols on the M links. For example, M(M−1)/2 difference-generating circuits 122 may receive the M symbols, where a given difference-generating circuit may be coupled to a given pair of links and may compare the received symbols associated with this given pair (which is sometimes referred to as 'pseudo-differential detection'). Note that in device 112 the difference-generating circuits 122 compare received symbols associated with all pairings of the M links (However, note that in other embodiments the difference-generating circuits 122 compare received symbols associated with a subset of the pairings of the M links.) Based on the outputs from the difference-generating circuits 122 (which identify a particular codeword), decoder 126 decodes the received M symbols to a corresponding set of N data symbols $DQ_i$ i.e., to data 128.

Table 1 provides a coding table or code space for use in multi-wire communication, such as that illustrated in system 100. This balanced code encodes 4 data bits or symbols (e.g., using one 16 numbers in a group of 20 numbers), represented by the input, as a corresponding codeword, which is communicated using 6 links in channel 114-1. Note that some of the codewords in the 4-6 encoding technique may be invalid. For example, while there are 64 possible symbols using 6 links and binary codewords, only 20 of these are balanced. In general, the N data symbols $DQ_i$ in data 116 are encoded and subsequently decoded using a set of $2^N$ codewords in a space of $2^M$ possible codewords.

TABLE 1

| | M symbols for links | | | | | | Difference-Generating-Circuit Outputs a-b\|a-c\|a-d\|a-e\|a-f\|b-c\|b-d\|b-e\|b-f\|c-d\| |
|---|---|---|---|---|---|---|---|
| Input | a | b | c | d | e | f | c-e\|c-f\|d-e\|d-f\|e-f |
| 0 | 1 | 1 | 1 | 0 | 0 | 0 | x\|x\|1\|1\|1\|x\|1\|1\|1\|1\|1\|1\|x\|x\|x |
| 1 | 1 | 1 | 0 | 1 | 0 | 0 | x\|1\|x\|1\|1\|1\|x\|1\|1\|0\|x\|x\|1\|1\|x |
| 2 | 1 | 1 | 0 | 0 | 1 | 0 | x\|1\|1\|x\|1\|1\|1\|x\|1\|x\|0\|x\|0\|x\|1 |
| 3 | 1 | 1 | 0 | 0 | 0 | 1 | x\|1\|1\|1\|x\|1\|1\|1\|x\|x\|x\|0\|x\|0\|0 |
| 4 | 1 | 0 | 1 | 1 | 0 | 0 | 1\|x\|x\|1\|1\|0\|0\|x\|x\|x\|1\|1\|1\|1\|x |
| 5 | 1 | 0 | 1 | 0 | 1 | 0 | 1\|x\|1\|x\|1\|0\|x\|0\|x\|1\|x\|1\|0\|x\|1 |
| 6 | 1 | 0 | 1 | 0 | 0 | 1 | 1\|x\|1\|1\|x\|0\|x\|x\|0\|1\|1\|x\|x\|0\|0 |
| 7 | 1 | 0 | 0 | 1 | 1 | 0 | 1\|1\|x\|x\|1\|x\|0\|0\|x\|0\|0\|x\|x\|1\|1 |
| 8 | 1 | 0 | 0 | 1 | 0 | 1 | 1\|1\|x\|1\|x\|x\|0\|x\|0\|0\|x\|0\|1\|x\|0 |
| 9 | 1 | 0 | 0 | 0 | 1 | 1 | 1\|1\|1\|x\|x\|x\|x\|0\|0\|x\|0\|0\|0\|0\|x |
| 10 | 0 | 1 | 1 | 1 | 0 | 0 | 0\|0\|0\|x\|x\|x\|1\|1\|x\|1\|1\|1\|1\|1\|x |
| 11 | 0 | 1 | 1 | 0 | 1 | 0 | 0\|0\|x\|0\|x\|1\|x\|1\|1\|x\|1\|1\|0\|x\|1 |
| 12 | 0 | 1 | 1 | 0 | 0 | 1 | 0\|0\|x\|x\|0\|x\|1\|1\|x\|1\|1\|x\|x\|x\|0\|0 |
| 13 | 0 | 1 | 0 | 1 | 1 | 0 | 0\|x\|0\|0\|x\|1\|x\|x\|1\|0\|0\|x\|x\|1\|1 |
| 14 | 0 | 1 | 0 | 1 | 0 | 1 | 0\|x\|0\|x\|0\|1\|x\|1\|x\|0\|x\|0\|1\|x\|0 |
| 15 | 0 | 1 | 0 | 0 | 1 | 1 | 0\|x\|x\|0\|0\|1\|1\|1\|x\|x\|x\|0\|0\|0\|0\|x |
| 16 | 0 | 0 | 1 | 1 | 1 | 0 | x\|0\|0\|0\|x\|0\|0\|0\|x\|x\|x\|x\|1\|x\|1\|1 |
| 17 | 0 | 0 | 1 | 1 | 0 | 1 | x\|0\|0\|x\|0\|0\|0\|x\|0\|x\|0\|x\|1\|x\|1\|x\|0 |
| 18 | 0 | 0 | 1 | 0 | 1 | 1 | x\|0\|x\|0\|0\|0\|x\|0\|0\|0\|x\|x\|0\|0\|x |

TABLE 1-continued

| | M symbols for links | | | | | Difference-Generating-Circuit Outputs a-b\|a-c\|a-d\|a-e\|a-f\|b-c\|b-d\|b-e\|b-f\|c-d\| |
|---|---|---|---|---|---|---|
| Input | a | b | c | d | e | f c-e\|c-f\|d-e\|d-f\|e-f |
| 19 | 0 | 0 | 0 | 1 | 1 | 1 x\|x\|0\|0\|0\|x\|0\|0\|0\|0\|0\|0\|x\|x\|x |

These codewords can be detected, and thus decoded, using 15 difference-generating circuits, such as sense amplifiers or sampling circuits. Binary outputs from these sense amplifiers may be used to assist in decoding the codewords. For example, +Vp and −Vp outputs may be used (as indicated by the '1' and the '0' in Table 1), while an output of 0 (indicated by an 'x' in Table 1) may be ignored during the decoding process. Consequently, in some embodiments the difference-generating circuits 122 may have binary outputs.

In general, as the data rate during communication between the devices increases the bit-error rate (BER) increases because the signal-to-noise ratio is reduced. Moreover, if the errors are random and have a low probability (i.e., the BER is low, for example, $10^{-8}$) then the dominant error events may be single bit errors. By detecting and correcting these single bit errors, the effective BER can be reduced significantly, for example, to $10^{-15}$.

Figure 1B:
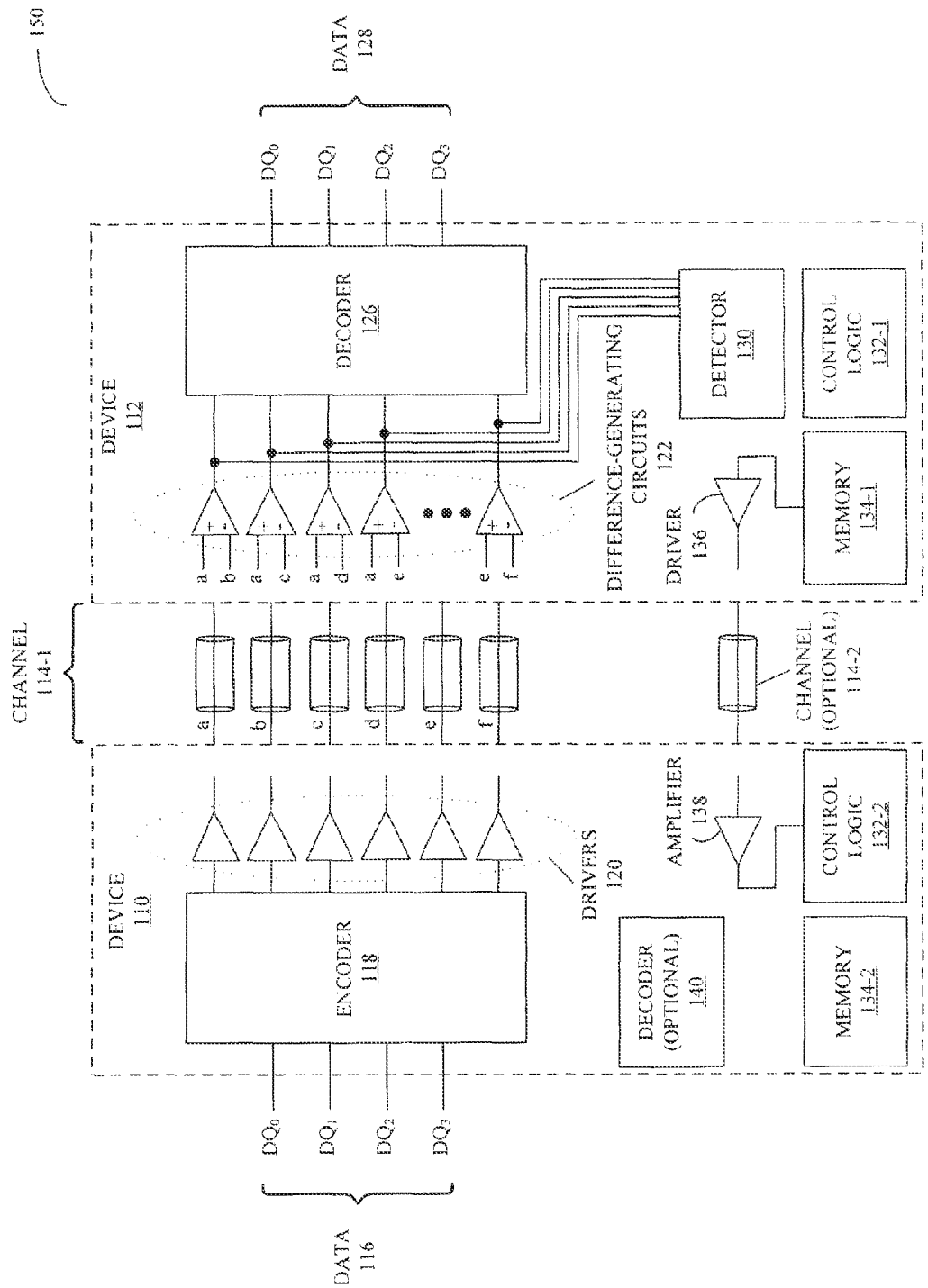
FIG. 1B is a block diagram illustrating an embodiment of a system.

Note that in embodiments where the codewords during multi-wire signaling are balanced, single bit errors correspond to four or two '1's (or, equivalently, four or two '0's). This facilitates 100% detection of these errors and remedial action, such as error correction or a retry scheme in which the affected data is retransmitted. For example, detector 130 may detect an imbalance in a number of instances of the first value in the set of M symbols and a number of instances of the second value in the set of M symbols. This may be implemented by monitoring the inputs and/or the outputs to decoder 126, as illustrated in system 100 and 150 (FIG. 1B). If an imbalance is detected, then detector 130 may assert an error condition. Note that the imbalance may be detected via digital and/or analog circuits.

Moreover, control logic 132-1 may perform remedial action if an error condition is asserted. This remedial action may include: communicating the error condition in the set of M symbols to device 110; correcting an error in one or more symbols in the set of M symbols; and/or, if at least one codeword can include a write mask, assuming that the error affects the write mask and disabling a write operation (during which data is received from device 110 for storage in a storage element in device 112). For example, one or more drivers, such as driver 136, may communicate information associated with the error condition via one or more links in channel 114-1 and/or via an optional separate channel 114-2. Note that this information may include: the set of M symbols that have the error condition; and/or one or more symbols in the set of M symbols that are associated with the error condition.

In some embodiments, the error condition may be communicated to device 110 during a read operation, in which device 112 communicates data to device 110. For example, if 4-6 encoding is used, only 16 of 20 possible balanced codewords are used to convey data. In this case, an error condition may be indicated using one of the four 'extra' balanced codewords in the codespace.

Device 110 may receive the information associated with an error condition, for example, using one or more amplifiers, such as amplifier 138. After this information is received, control logic 132-2 may perform remedial action. For example, device 110 may store write data (associated with write operations) that has been communicated to device 112 since the last read operation in a buffer, such as memory 134-2. When alerted to the occurrence of an error condition at device 112 during a write operation (for example, during the next subsequent read operation following the write error), control logic 132-2 may instruct memory 134-2 to provide at least a portion of the stored write data, which is associated with the error condition, to encoder 118 for encoding and retransmission to device 112.

In some embodiments, when alerted to the occurrence of an error condition (for example, during a current read operation), all of the write data since the previous read operation is retransmitted to device 112. However, in some embodiment the information associated with the error condition that is communicated to device 110 may include a time or location associated with the error condition. This may allow a subset of the write data stored in memory 134-2 to be retransmitted. Note that in order to prevent overflow of memory 134-2, in some embodiments control logic 132-2 communicates instructions for a read operation to device 112 if a time interval has passed since a previous read operation.

Moreover, in some embodiments the remedial action performed by control logic 132-1 and/or 132-2 may include storing information about one or more links that are associated with the error condition. For example, the affected link information may be stored in memory 134-1 based on instructions from control logic 132-1. Over time (after multiple single bit errors), the link information stored in either or both memories 134 can be used to identify a 'bad' link (e.g., one that is associated with errors) in channel 114-1. Furthermore, the identification of such a bad link may be used to perform error correction.

Figure 2A:
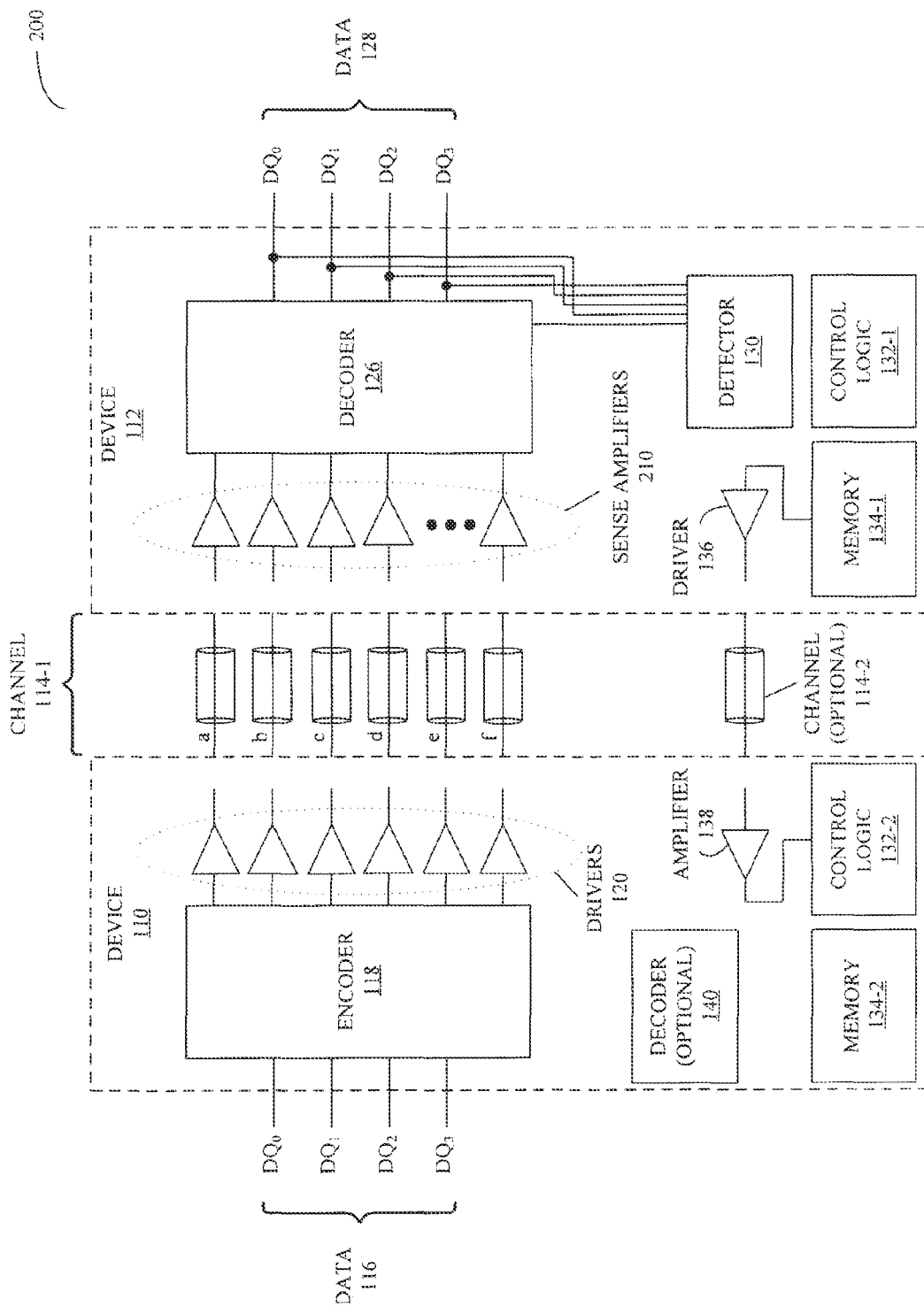
FIG. 2A is a block diagram illustrating an embodiment of a system.
Figure 2B:
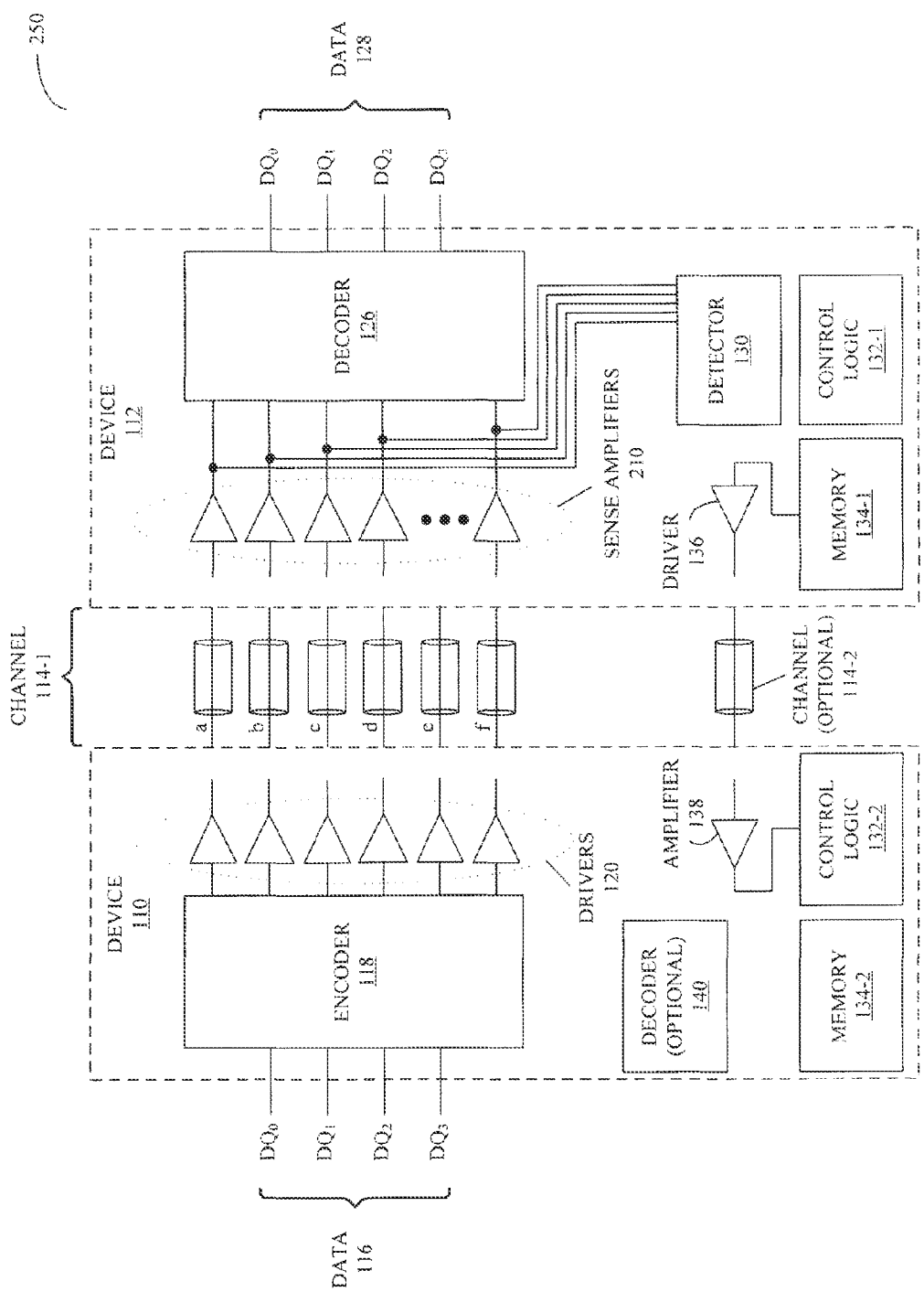
FIG. 2B is a block diagram illustrating an embodiment of a system.

Performance during multi-wire communication can be limited by the input sensitivity of the difference-generating circuits 122 and/or sense amplifiers 210 (FIGS. 2A and 2B). For example, the input sensitivity can be limited by voltage offsets, such as that due to: transistor mismatch (for example, due to process variations or manufacturing errors), as well as voltage and/or temperature variations. In some embodiments, the offset voltages are determined and cancelled when a given difference-generating circuit outputs 0 (which is indicated by an 'x' in Table 1). In particular, a given difference-generating circuit outputs 0 when the inputs to the receiver are substantially the same (such as, when the inputs are within 5-10% of each other). Note that in embodiments where the given difference-generating circuit has a binary output (such as if it is sampled using a 1-bit analog-to-digital converter), on average the differential output should be approximately at either of the extremes of the voltage swing (+Vp or −Vp) 50% of the time when the inputs to the given difference-generating circuit are substantially the same. As described below, this allows the offset voltage to be determined and corrected.

Figure 3:
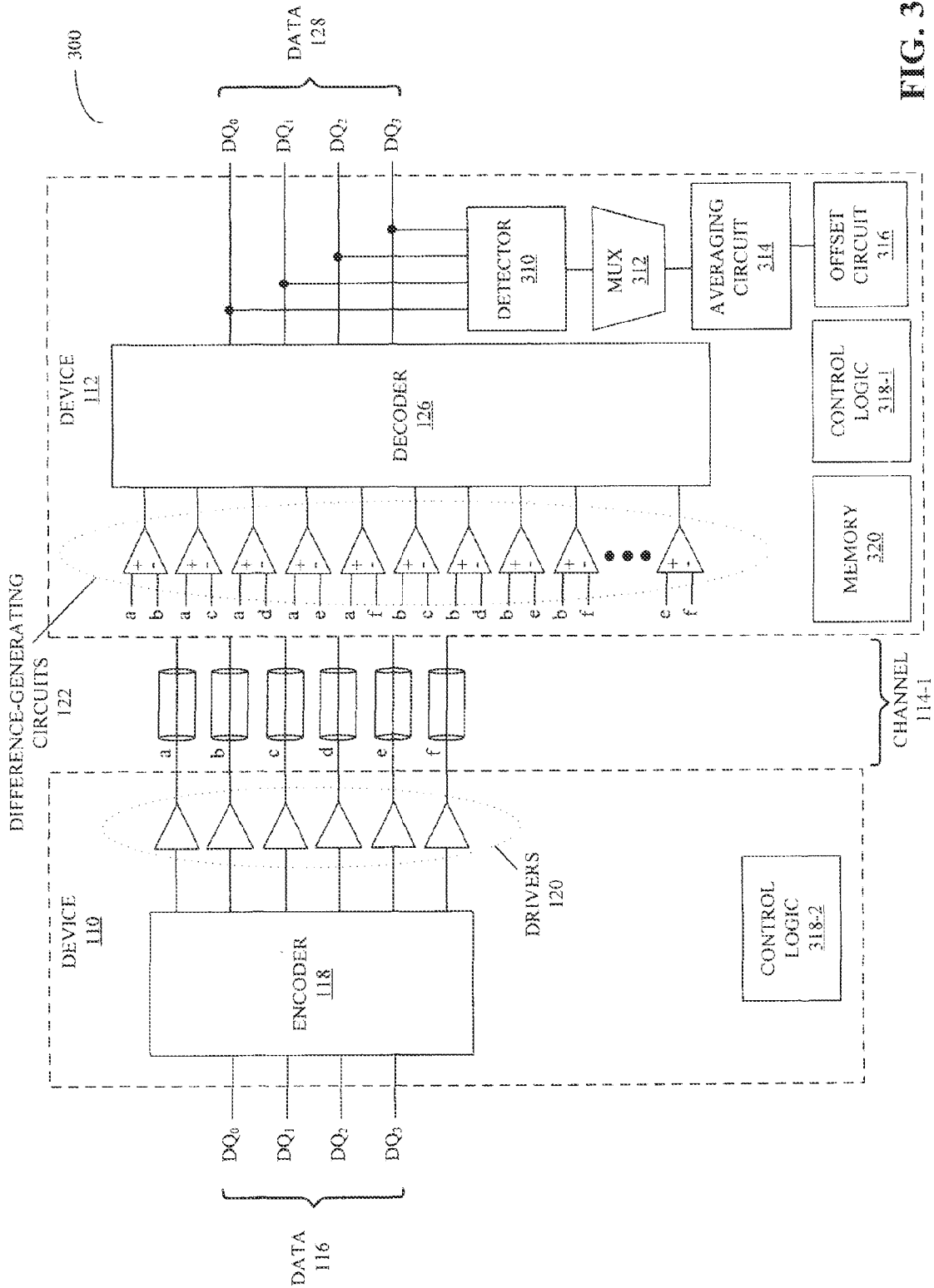
FIG. 3 is a block diagram illustrating an embodiment of a system.

In particular, during the symbol times where the inputs to the given difference-generating circuit are substantially the same, the output from the given difference-generating circuit is a representation of the inherent offset of this individual circuit and can be accumulated using an offset-compensation circuit, such as an offset-correction averaging circuit. This is shown in FIG. 3, which presents a block diagram illustrating an embodiment of a system 300. In device 112, detector 310 may identify when inputs to the given difference-generating circuit are substantially the same. Based on this information, multiplexer (MUX) 312 may selectively couple the output from the given difference-generating circuit to averaging circuit 314, and offset circuit 316 (which is an offset-compensation circuit) may use the average results as determined by the difference circuits 122 over multiple symbol times (e.g., over multiple codewords in which the inputs to the given difference-generating circuit are substantially the same) to determine and correct the offset voltage of the given difference-generating circuit.

In some embodiments, control logic 318-1 may instruct multiplexer (MUX) 312 to selectively couple the output from the given difference-generating circuit to averaging circuit 314 based on information received from detector 310. Additionally, control logic 318-1 may instruct multiplexer (MUX) 312 to selectively couple each of at least the M difference-generating circuits 122 to the averaging circuit 314 during a sequence of time intervals, such as over multiple symbol times.

Moreover, in some embodiments the offset voltage of the given difference-generating circuit may be stored in a register, such as memory 320, which may be revised (for example, during an update) after averaging of the current offset voltage has been performed over multiple symbol times. Note that correcting for this offset voltage may be implemented using digital and/or analog circuits. Additionally, note that this offset voltage determination and correction technique may be implemented during a normal operation mode of system 300 (e.g., continuously) or may be implemented during a calibration operation mode, which may be performed: periodically, as needed (for example, based on one or more performance metrics), and/or after a pre-determined time interval. Furthermore, this offset calibration and correction technique may not be limited to the particular multi-wire code shown but rather applies (continuously) to a broad class of differential transmission of coded information where there the code includes equal numbers of positive and negative values, or more generally, equal numbers of first and second values.

Embodiments of one or more of these circuits, integrated circuits, systems and/or techniques may be used during inter-chip and/or intra-chip communication. For example, these techniques may be used in memory systems and/or memory devices that include different types of memory, such as: volatile memory, non-volatile memory, dynamic random access memory (DRAM), static random access memory (SRAM), read-only memory (ROM), erasable programmable read-only memory (EPROM), electrically erasable programmable read-only memory (EEPROM), flash, solid-state memory, and/or another type of memory. Moreover, for a given type of memory, these techniques may be used in different memory technologies or technology generations (which may use different power supply voltages). For example, these techniques may be used in: extreme data rate (XDR), dual-data rate (DDR), graphics dual-data rate (GDDR) and/or synchronous DRAM, such as: DDR2, DDR3, DDRx, GDDR1, GDDR3, GDDR5, and/or mobile DDR.

Consequently, memory components (such as a memory controller, a memory device, a memory module, and/or a memory system) that use these techniques may be included in a wide variety of applications, such as: desktop or laptop computers, computer systems, hand-held or portable devices (such as personal digital assistants and/or cellular telephones), set-top boxes, home networks, and/or video-game devices. For example, a storage device (such as the memory module) may be included in computer main memory. Moreover, one or more of these embodiments may be included in a communication channel, such as: serial or parallel links, metropolitan area networks, local area networks (LANs), and/or personal area networks (PANs).

In the discussion that follows, note that single-ended communication or signaling may be defined as a technique for transmitting information by varying an electrical signal (such as a voltage or a current) over one wire or link for comparison with a reference conveyed over another wire or link. In general, multiple single-ended signals can share a reference, such as a voltage reference. Moreover, differential communication or signaling may be defined as a technique for transmitting information by varying complementary electrical signals conveyed on given wires or links.

Additionally, in some embodiments multiple-wire or multi-wire communication or signaling is defined as a technique for transmitting symbols over a set of at least three wires or links by encoding each symbol into at least three electrical signals (for example, using a 1-3 encoding technique) for transmission over a given group of links. At a receiver, each symbol conveyed using multi-wire signaling may be decoded using at least the three signals on the given group of links. As noted previously, in some embodiments balanced multi-wire signaling is used, in which the sum of the values of the electrical signals is constant over multiple symbols times. Moreover, in some embodiments multi-wire differential signaling is used, in which the codewords can be detected by looking at the voltage difference between all pairs of links.

However, in some embodiments multi-wire signaling is used to communicate binary symbols in parallel over a pair of links during one time interval, and another pair of links (which may be different than the pair of links) is used to communicate binary symbols during a subsequent time interval. Consequently, a more general definition of multi-wire signaling is spatially and/or temporally encoded differential signaling (which is sometimes referred to as 'pseudo-differential signaling'), thereby encompassing embodiments in which symbols are physically distributed over different wires (for example, the spatial distribution may happen over time, from one time interval to the next, or from one symbol to the next).

We now further describe embodiments of circuits, devices and systems to communicate data. One technique for encoding data for communication between devices, such as a memory controller and a memory device, is based on multi-wire communication. In this technique, a set of N bits (or more generally, data symbols) to be transmitted are encoded as a corresponding set of M symbols (which are referred to as 'codewords'), which are then communicated using M wires or links. At a receiver, the set of M symbols can be detected and decoded using as many as $M(M-1)/2$ sense amplifiers. For example, using 6 single-ended wires, a group of 4 symbols can be communicated. In contrast, in a differential configuration, 6 wires can be used to communicate a group of 3 data symbols. Consequently, multi-wire communication can offer increased communication bandwidth. Moreover, when balanced codewords are used, multi-wire signaling can also: reduce or eliminate simultaneous switching noise; increase noise immunity; and increase signal swing.

Note that while these techniques can be used with a variety of coding and receiving techniques, in the discussion that follows binary codes are used as an illustrative example.

As discussed previously, in multi-wire communication, the set of M symbols can be detected using as many as $M(M-1)/2$ sense amplifiers, which function as difference-generating circuits (such as difference-generating circuits 122 in FIG. 1A). For example, with the 4-6 encoding technique, as many as 15 difference-generating circuits may be used. This configuration is shown in FIG. 1A, which we now describe in more detail.

In system 100, device 110 communicates information with device 112 via the channel 114-1 (for example, during a write operation from a memory controller). During this communication, device 110 receives data 116, including N data symbols $DQ_i$, at a given clock edge or during the given time interval (if there is a slight variation in the arrival time of the N data symbols). These data symbols are encoded using an N-M encoding technique (in which the code space encodes symbols associated with a given codeword on multiple wires or links) by encoder 118, which outputs M symbols corresponding to the N data symbols. Next, these M symbols are transmitted by drivers 120 as analog or digital signals onto M wires or links (such as links a through f) in channel 114-1. Note that these drivers may have different gain values or weighting Moreover, drivers 120 may include single-ended drivers.

As previously illustrated in Table 1, during the N-M encoding technique the N data symbols in an input space are mapped to a corresponding set of M symbols or a codeword in an output space. In some embodiments, N is a positive number and M is a positive, even integer. For example, as illustrated in Table 1, N may be 4, M may be 6, and encoder 118 may implement a 4-6 encoding technique. In other embodiments, N is 6 or 7, M is 8 or 10, and encoder 118 implements a 6-8 or a 7-10 encoding technique. In general N is less than M, and M is less than 2N.

Moreover, in some embodiments N is a positive number and M is a positive, odd integer. Consequently, embodiments of the N-M encoding technique include: 1-3 encoding, 1.5-3 encoding, 3-5 encoding, 5-7 encoding, and/or 7-9 encoding. Additionally, in some embodiments cascaded or composite encoding techniques are used, which combine two or more of these encoding techniques.

At device 112, at least M difference-generating circuits 122 receive (or sample) the M symbols on the M links at a given clock edge or during the given time interval (if there is a slight variation in the arrival time of the M symbols). Note that in some embodiments there are fewer than $M(M-1)/2$ difference-generating circuits 122. For example, there may be $M(M/2-1)/2$ difference-generating circuits 122. Moreover, a given difference-generating circuit may be coupled to a given pair of links and may compare the received symbols associated with this given pair. In an exemplary embodiment, the links are single-ended and/or the difference-generating circuits 122 are differential amplifiers or differential comparators. However, in some embodiments the at least M difference-generating circuits 122 include single-ended amplifiers, such as sense amplifiers 210 (FIGS. 2A and 2B) in systems 200 (FIG. 2A) and 250 (FIG. 2B). In these embodiments, a given input node is coupled to a given difference-generating circuit in the at least M difference-generating circuits 122.

Outputs from the difference-generating circuits 122 are coupled to decoder 126, which decodes the received M symbols to a corresponding set of N data symbols $DQ_i$, i.e., to data 128. In particular, as discussed previously, the decoding is based on the outputs from the difference-generating circuits 122, which identify a particular set of M symbols or a particular codeword.

Device 112 may also communicate information with device 110 via the channel 114-1 (for example, during a read operation from a memory device). During this communication, device 112 receives data 128, including N data symbols $DQ_i$ (for example, from one or more storage elements in a memory), at a given clock edge or during the given time interval (if there is a slight variation in the arrival time of the N data symbols). These data symbols may be encoded in an encoder using one or more codewords. As discussed further below, this encoding may be the same as that used by encoder 118 (e.g., N-M encoding) or may use a different encoding technique (e.g., asymmetric or different coding may be used when communicating in different directions in system 100).

Next, the one or more symbols are transmitted by drivers (such as driver 136) in device 112 as analog or digital signals onto at least a subset of the M wires or links (such as links a through f) in channel 114-1. These drivers may have different gain values or weighting Moreover, the drivers may include single-ended drivers.

At device 110, difference-generating circuits or sense amplifiers (such as amplifier 138) may receive (or sample) the one or more symbols on at least the subset of the M links at a given clock edge or during the given time interval (if there is a slight variation in the arrival time of the M symbols). Note that the number of links used to transmit symbols and the number of links used to receive symbols at a given device may be different. Moreover, as noted previously, in some embodiments an optional channel 114-2 may be used to communicate at least some information between device 112 and device 110. In an exemplary embodiment, the links are single-ended and/or the sense amplifiers are differential amplifiers. However, in some embodiments the sense amplifiers include single-ended amplifiers.

Outputs from the sense amplifiers (such as amplifier 138) are coupled to an optional decoder 140, which decodes the one or more received symbols to a corresponding set of N data symbols $DQ_i$ i.e., to data 116. This decoding technique may use one or more codewords in a different code space or the same code space as the code space used in decoder 126.

As noted previously, the use of balanced codewords during communication between devices 110 and 112 can facilitate the detection of single bit errors and corresponding remedial action. In this regard, note that in embodiments where N-M encoding is used in both communication directions between devices 110 and 112, the error detection and the corresponding remedial action may be performed by either or both of devices 110 and 112.

Moreover, as noted previously, in some embodiments difference-generating circuits 122 may be single-ended amplifiers (such as sense amplifiers 210 in FIGS. 2A and 2B). While note shown in these figures, note that one or more reference voltages that track noise signals during communication between devices 110 (FIGS. 2A and 2B) and 112 (FIGS. 2A and 2B) may be obtained by partially terminating the M links to a common node of sense amplifiers 210 (FIGS. 2A and 2B). Consequently, the one or more reference voltages may be generated on-chip or may be an external reference voltage (e.g., a reference voltage may be generated off-chip). In some embodiments, the one or more reference voltages are extracted from the common mode of signals corresponding to M symbols when the M symbols are balanced (e.g., the M symbols include an equal number of instances of a first value and a second value).

Note that the total capacitance associated with receive circuits in a memory controller may be lower than the total capacitance associated with receive circuits in a memory device (such as a DRAM). In particular, the number of metal layers in a memory device may be fewer than in a memory controller (such as in Application Specific Integrated Circuit or ASIC) and the input pads may be closer to the substrate, thereby increasing the capacitance. For example, an ASIC process may have 8 metal layers and a DRAM process may have 3 metal layers.

Consequently, if an N-M encoding technique is used when transmitting data from device 110 to device 112 (i.e., in the read direction), the use of multiple difference-generating circuits in device 112 may reduce the bandwidth and, thus, the data rate during communication. As noted previously, to reduce or eliminate this problem, in some embodiments asymmetric coding may be used. For example, an encoder in device 112 may implement 4-6 encoding, and a decoder in device 110 may implement 15-4 decoding, while encoder 118 may implement 4-6 encoding and decoder 126 may implement 6-4 decoding. This asymmetry may allow memory devices to receive and decode symbols using fewer amplifiers than the memory controller, thereby more effectively balancing the total capacitance of the input circuits on either side of channel 114-1, thus, balancing the data rates in both directions on the M links. However, in some embodiments N-M encoding/decoding is used when communicating in either direction in system 100.

Therefore, a wide variety of encoding techniques may be implemented by the encoder in device 110, including: the previously described N-M encoding techniques, a code that includes Dynamic Bus Inversion (or Data Bus Inversion), an 8-10 code, an 8-9 code, an 8-11 code, and/or a 2-12 code (for example, two instances of a 4-6 code).

Continuing the discussion of FIG. 3, in some embodiments at least the M difference-generating circuits 122 have binary outputs, and the offset compensation may be based on a deviation from an expected number of instances of the first value in the output (such as +Vp) from the given difference-generating circuit and a number of instances of the second value in the output (such as −Vp) from the given difference-generating circuit during multiple time intervals, such as symbol times.

In some embodiments, the offset circuit 316 separately monitors the output from the given difference-generating circuit when the inputs each have substantially a first value (such as +1) and when the inputs each have substantially a second value (such as 0). Moreover, the offset compensation may be based on both the monitored output when the inputs each have substantially the first value and the monitored output when the inputs each have substantially the second value. For example, the offset compensation may be based on a deviation from an expected number of instances of the first value in the output and a number of instances of the second value in the output during the multiple time intervals in the output when the inputs each have substantially the first value or the output when the inputs each have substantially the second value.

In some embodiments, the output when the inputs each have substantially the first value and the output when the inputs each have substantially the second value may be combined to determine the offset compensation. Alternatively, if both accumulated outputs indicate that the offset compensation should be reduced then the offset compensation may be reduced; if both accumulated outputs indicate that the offset compensation should be increased in one direction then the offset compensation may be increased; and if one accumulated output indicates that the offset compensation should be reduced in that direction and the other accumulated output indicates that the offset compensation should be increased, then the offset compensation may be either reduced, increased or unchanged (so long as the same choice is applied consistently).

In an exemplary embodiment, if the inputs to the given difference-generating circuit are 0 for a long time, and the output from the given difference-generating circuit is sampled with a zero threshold slicer, an equal number of '1' and '0' signals should be observed over multiple time intervals. If the output is always a '1' then the offset should be adjusted until an equal number of '1' and '0' are observed. Similarly, if the output is always a '0' then the offset should be adjusted until an equal number of '1' and '0' are observed. Note that, ideally, this type of offset-compensation loop can be expected to dither or alternate about the current offset-compensation value.

Note that in some embodiments, codewords provided by device 110 during a sequence of time intervals are scrambled so that at least the M difference-generating circuits 122 have an equal number of occurrences where their inputs are the same during the sequence of time intervals. Similarly, device 112 may include a descrambler to restore an original order of the codewords during the sequence of time intervals. Note that the scrambler may be implemented by encoder 118 and/or control logic 318-2, and the descrambler may be implemented by decoder 126 and/or control logic 318-1. In some embodiments, scrambling/descrambling is implemented using a pseudo-random sequence generator and XOR gates.

While illustrated with differential difference-generating circuits 122, in some embodiments the offset determination and correction technique may be implemented in devices that use single-ended sense amplifiers (such as sense amplifiers 210 in FIGS. 2A and 2B). Additionally, note that a similar technique can be utilized to determine timing information in band-limited signaling. Consequently, a timing offset associated with the given difference-generating circuit can also be determined and corrected.

Figure 4:
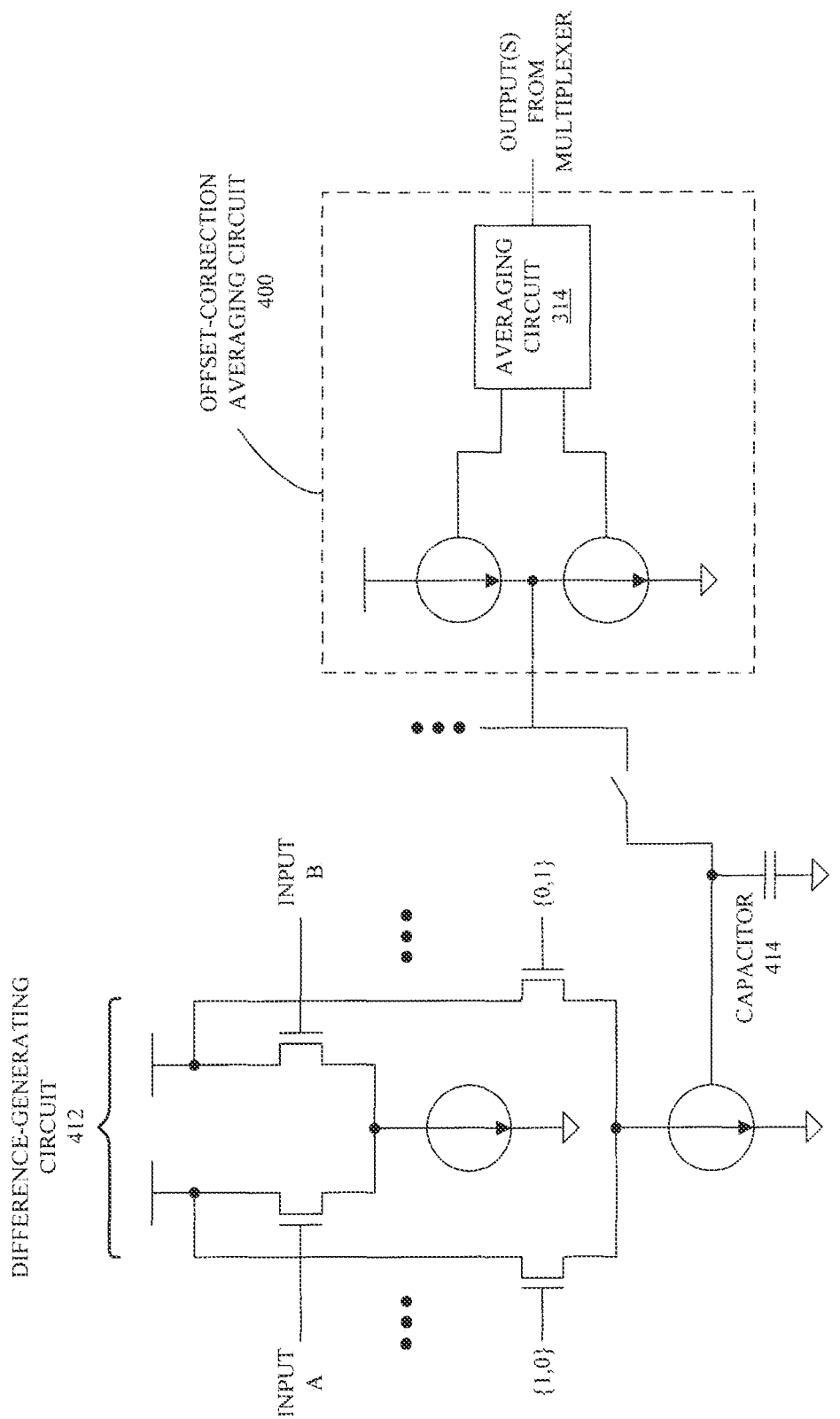
FIG. 4 is a block diagram illustrating an embodiment of an offset-correction averaging circuit.

As noted previously, the offset-compensation correction may be implemented using digital and/or analog circuits. An exemplary embodiment is shown in FIG. 4, which presents a block diagram illustrating an embodiment of an offset-correction averaging circuit 400. In particular, a charge pump (or digital equivalent) in the offset-correction averaging circuit 400 may apply charge corresponding to an offset compensation for a given difference-generating circuit, such as difference-generating circuit 412, to a storage device, such as a capacitor 414. Moreover, the storage charge on capacitor 414 may modify a current provided by a voltage-controlled current source in difference-generating circuit 412. Additionally, the inputs to the differential pair on the correction or offset port of difference-generating circuit 412 may, respectively, by '1' and '0' or '0' and '1' depending on the need for a positive negative offset correction with respect to inputs A and B. Note that offset-correction averaging circuit 400 may be shared by several difference-generating circuits, where each circuit will typically have an independent offset port as shown in difference-generating circuit 412. (However, each instance of the difference-generating circuit may have a separate capacitor, such as capacitor 414, or the digital equivalent.) Consequently, a switch or a multiplexer may be used to couple the offset-correction averaging circuit 400 to the given difference-generating circuit. Moreover, in some embodiment multiplexing is performed elsewhere in the path between the difference-generating circuit 412 and the capacitor 414.

Note that at least some aspects of the various embodiments in FIGS. 1-4 may be combined with each other. Moreover, components and/or functionality illustrated in the embodiments shown in FIGS. 1-4 may be implemented using analog circuits and/or digital circuits. Note that circuits may be implemented using NMOS and/or PMOS transistors.

Additionally, components and/or functionality in these embodiments may be implemented using hardware and/or software. For example, encoder 118 (FIGS. 1-2) and/or decoder 126 (FIGS. 1-2) may be included in control logic, such as a processor or a processor core. Moreover, the encoding and the decoding may be at least partially implemented using a look-up table and/or a state machine.

Note that these embodiments may include fewer components or additional components. For example, there may be additional instances of transmit circuits and/or receive circuits in systems 100 (FIG. 1A), 150 (FIG. 1B), 200 (FIG. 2A), 250 (FIG. 2B), and/or 300 (FIG. 3). Moreover, in some embodiments additional techniques may be used to reduce the total capacitance associated with the receive circuits, including: buffer circuits; equalizers (such as a linear equalizer or a Decision Feedback Equalizer); disaggregated amplifiers (in which, for example, a first transconductance stage in a differential amplifier is proximate to input pads and a second transimpedance stage in the differential amplifier is remotely located from the input pads); and/or generating circuits that generate M(M−1)/2 difference signals based on a smaller number of difference signals provided by difference-generating circuits.

Additionally, in some embodiments skew compensation is used to reduce or eliminate differences or skew in the arrival times of two or more symbols on different links. Note that the transmit phase and/or the receive phase may be adjusted at either or both of the memory controller and the memory device to compensate for skew. However, in many memory systems it may be too expensive to perform such adjustments at both ends of the channel. Consequently, in some embodiments the transmit phase at the memory controller may be adjusted to compensate for skew when transmitting data (for example, during a write operation) and/or the receive phase at the memory controller may be adjusted to compensate for skew when receiving data (for example, during a read operation).

In some embodiments, the transmitting and receiving of signals may be gated based on one or more timing signals that are provided by a frequency synthesizer. Consequently, signals may be transmitted and/or received based on either or both edges (e.g., these circuits may use dual data rate) in the one or more timing signals. Moreover, in some embodiments, transmitting and receiving may be synchronous and/or asynchronous.

These timing signals may be generated based on one or more clock signals, which may be generated: on-chip (for example, using a phase-locked loop and one or more timing reference signals provided by a frequency reference), off-chip, and/or recovered from received signals. Moreover, voltage levels and/or a voltage swing of the signals that are transmitted may be based on voltages provided by a power supply, and logic levels of the data that is received may be based on voltages provided by the power supply. These voltages may be fixed or may be adjustable.

In embodiments where systems 100 (FIG. 1A), 150 (FIG. 1B), 200 (FIG. 2A), 250 (FIG. 2B), and/or 300 (FIG. 3) are included in memory systems, a transmitter and receiver (or an instance of a transmit circuit and a receive circuit) may be coupled to a separate command link (or communication channel), which communicates commands.

Additionally, two or more components can be combined into a single component and/or the position of one or more components can be changed.

Figure 5A:
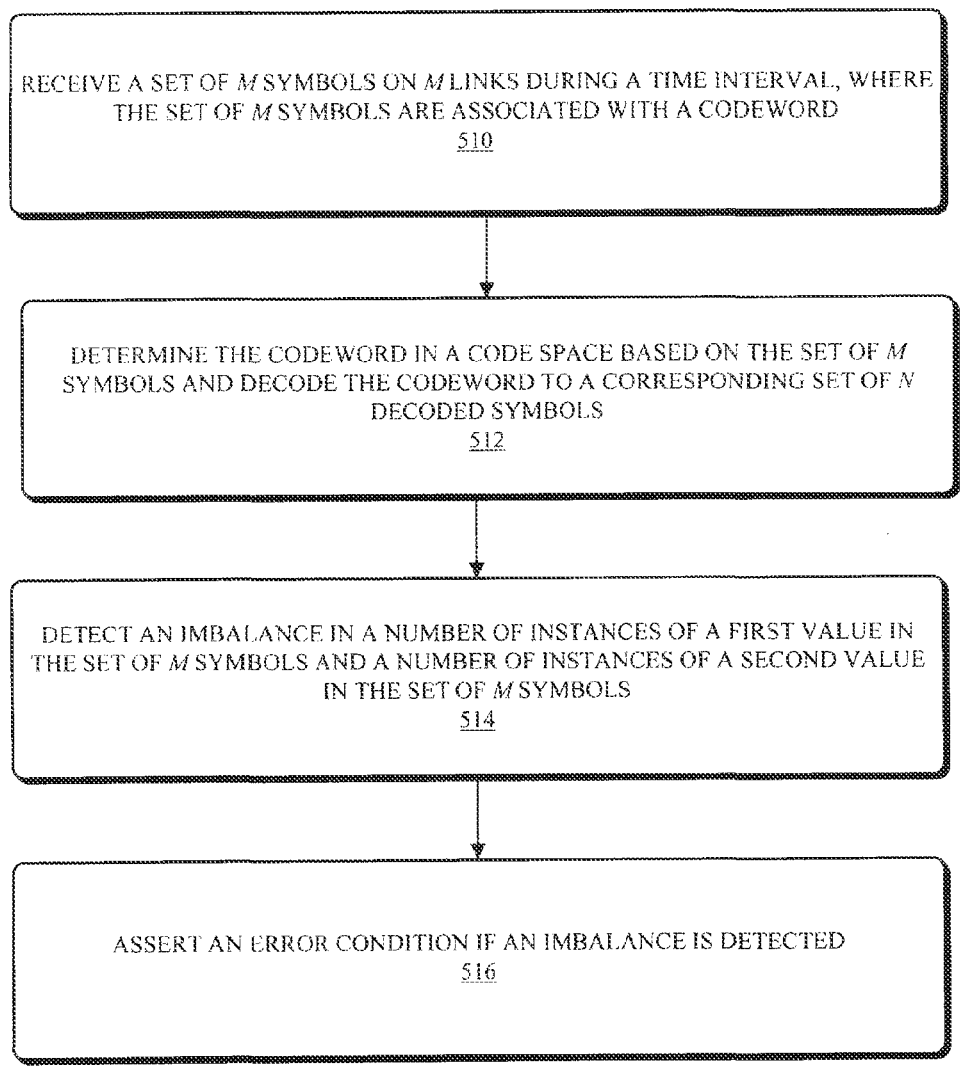
FIG. 5A is a flowchart illustrating an embodiment of a process for communicating information.

We now describe embodiments of a process for communicating data. FIG. 5A presents a flowchart illustrating a process 500 for communicating data, which may be performed by a device (such as a memory controller and/or a memory device). During operation, the device receives a set of M received symbols on M links during a time interval (510), where the set of M symbols are associated with a codeword. Next, the device determines the codeword in a code space based on the set of M symbols and decodes the codeword to a corresponding set of N decoded symbols (512). Then, the device detects an imbalance in a number of instances of a first value in the set of M symbols and a number of instances of a second value in the set of M symbols (514). Then, the device asserts an error condition if an imbalance is detected (516).

Figure 5B:
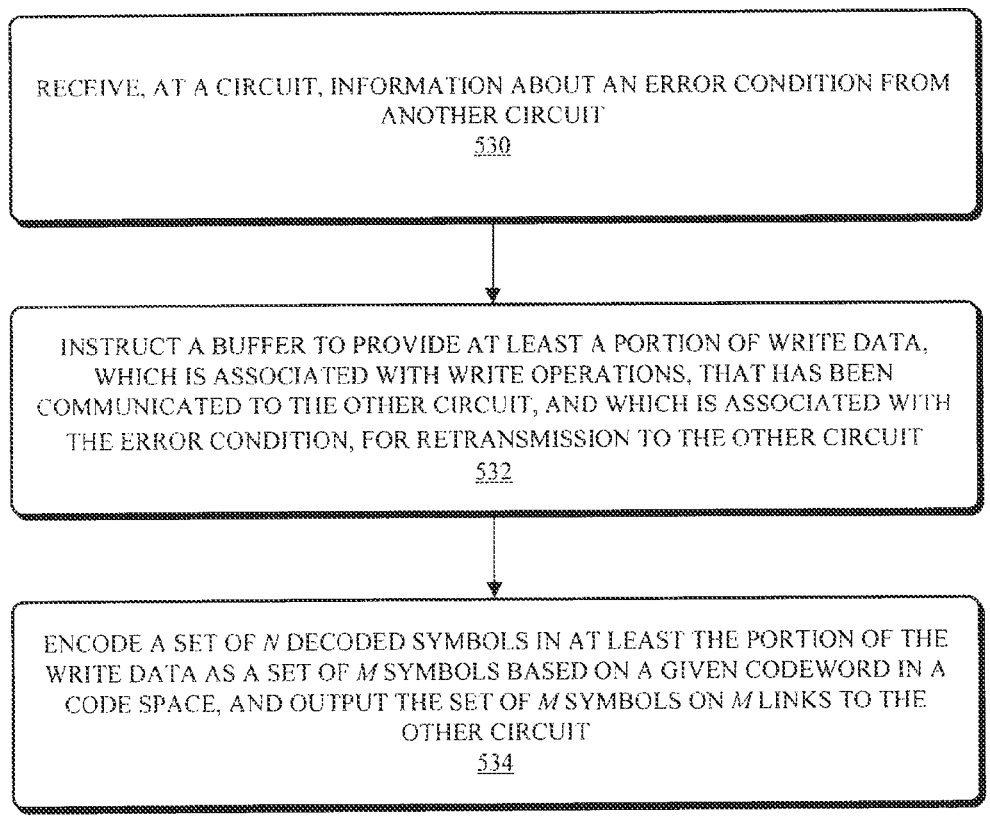
FIG. 5B is a flowchart illustrating an embodiment of a process for communicating information.

FIG. 5B presents a flowchart illustrating a process 520 for communicating data, which may be performed by a device (such as a memory controller and/or a memory device). During operation, the device receives, at a circuit, information about an error condition from another circuit (530). Next, the device instructs a buffer to provide at least a portion of write data, which is associated with write operations, that has been communicated to the other circuit, and which is associated with the error condition, for retransmission to the other circuit (532). Then, the device encodes a set of N decoded symbols in at least the portion of the write data as a set of M symbols based on a given codeword in a code space, and outputs the set of M symbols on M links to the other circuit (534).

Figure 5C:
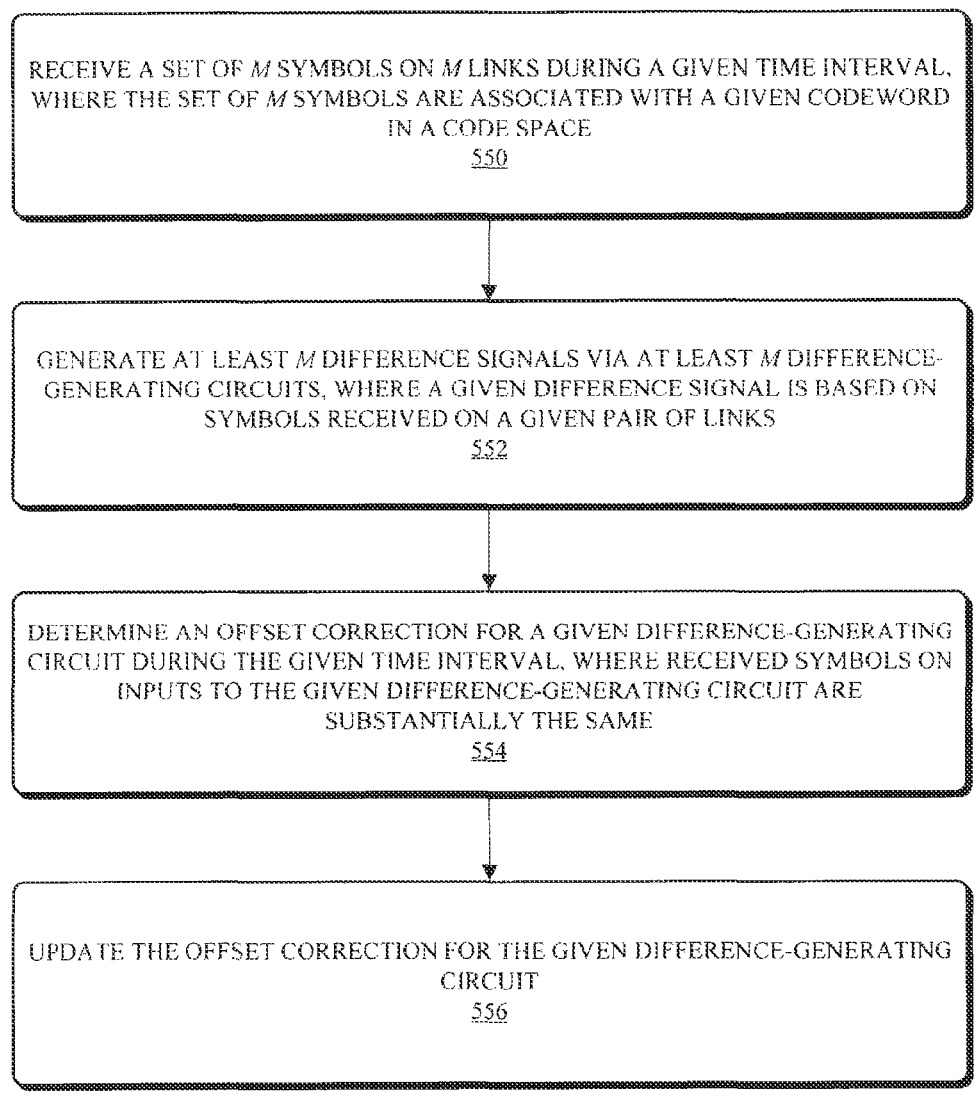
FIG. 5C is a flowchart illustrating an embodiment of a process for communicating information.

FIG. 5C presents a flowchart illustrating a process 540 for communicating data, which may be performed by a device (such as a memory controller and/or a memory device). During operation, the device receives a set of M symbols on M links during a given time interval (550), where the set of M symbols are associated with a given codeword in a code space. Next, the device generates at least M difference signals via at least M difference-generating circuits, where a given difference signal is based on symbols received on a given pair of links (552). Then, the device determines an offset correction for a given difference-generating circuit during the given time interval (554), where received symbols on inputs to the given difference-generating circuit are substantially the same. Moreover, the device updates the offset correction for the given difference-generating circuit (556).

In some embodiments of the processes 500 (FIG. 5A), 520 (FIG. 5B), and/or 540, there may be fewer or additional operations. Moreover, two or more operations can be combined into a single operation, and/or a position of one or more operations may be changed.

Figure 6:
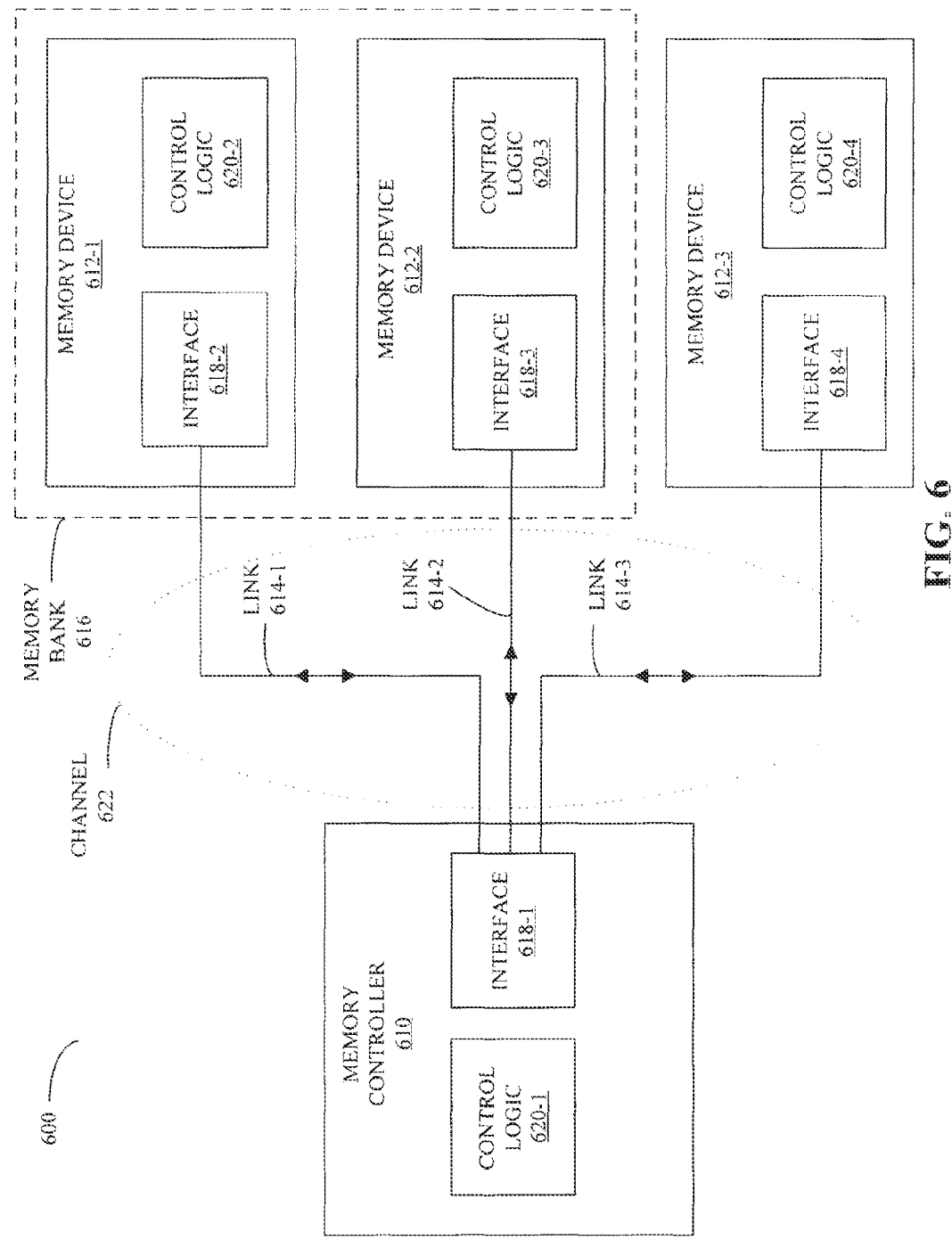
FIG. 6 is a block diagram illustrating an embodiment of a memory system.

We now further describe systems that may utilize one or more embodiments of the technique for communicating data. FIG. 6 is a block diagram illustrating an embodiment of a memory system 600. This memory system includes at least one memory controller 610 and one or more memory devices 612, such as one or more memory modules. While FIG. 6 illustrates memory system 600 having one memory controller 610 and three memory devices 612, other embodiments may have additional memory controllers and fewer or more memory devices 612. Moreover, while memory system 600 illustrates memory controller 610 coupled to multiple memory devices 612, in other embodiments two or more memory controllers may be coupled to one another. Note that memory controller 610 and one or more of the memory devices 612 may be implemented on the same or different integrated circuits, and that these one or more integrated circuits may be included in a chip-package.

In some embodiments, the memory controller 610 is a local memory controller (such as a DRAM memory controller) and/or is a system memory controller (which may be implemented in a microprocessor).

Memory controller 610 may include an I/O interface 618-1 and control logic 620-1. As discussed previously with reference to FIGS. 1-3, control logic 620-1 may be used to encode data for transmission by the interface 618-1 to one or more of the memory devices 612 and/or to decode data received by the interface 618-1 from one or more of the memory devices 612 (for example, using a modulation code).

In some embodiments, one or more of memory devices 612 include control logic 620 and at least one of interfaces 618. However, in some embodiments some of the memory devices 612 may not have control logic 620. Moreover, memory controller 610 and/or one or more of memory devices 612 may include more than one of the interfaces 618, and these interfaces may share one or more control logic 620 circuits. Note that in some embodiments two or more of the memory devices 612, such as memory devices 612-1 and 612-2, may be configured as a memory bank 616.

Memory controller 610 and memory devices 612 are coupled by one or more links 614 in a channel 622. While memory system 600 illustrates three links 614, other embodiments may have fewer or more links 614. These links may include: wired, wireless and/or optical communication. Moreover, links 614 may be used for bi-directional and/or uni-directional communications between the memory controller 610 and one or more of the memory devices 612. For example, bi-directional communication between the memory controller 610 and a given memory device may be simultaneous (full-duplex communication). Alternatively, the memory controller 610 may transmit information (such as a data packet which includes a command) to the given memory device, and the given memory device may subsequently provide requested data to the memory controller 610, e.g., a communication direction on one or more of the links 614 may alternate (half-duplex communication). Note that one or more of the links 614 and corresponding transmit circuits and/or receive circuits may be dynamically configured, for example, by one of the control logic 620 circuits, for bi-directional and/or unidirectional communication.

Signals corresponding to data and/or commands (such as request-for-data commands) may be communicated on one or more of the links 614 using either or both edges in one or more timing signals. These timing signals may be generated based on one or more clock signals, which may be: generated on-chip (for example, using a phase-locked loop and one or more timing reference signals provided by a frequency reference), off-chip, and/or recovered from the communicated signals. In some embodiments, transmitting and receiving these signals may be synchronous and/or asynchronous.

Note that modulation coding may include bit-to-symbol coding in which one or more data bits are mapped together to a data symbol, and symbol-to-bit coding in which one or more symbols are mapped to data bits. For example, a group of two data bits can be mapped to one of four different amplitudes of an encoded data signal. In general, the encoding is pulse amplitude modulation (PAM). For example, the modulation coding may include: two-level pulse amplitude modulation (2-PAM), three-level pulse amplitude modulation (3-PAM), and/or four-level pulse amplitude modulation (4-PAM). More generally, the modulation coding may include N-PAM, where N is an integer.

Note that the modulation coding may be dynamically adjusted, for example, based on a performance metric associated with communication on one or more of the links 614. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

In some embodiments, commands are communicated from the memory controller 610 to one or more of the memory devices 612 using a separate command link, e.g., using a subset of the links 614, which communicate commands. This separate command link may be: wireless, optical and/or wired. However, in some embodiments commands are communicated using the same portion of the channel 622 (i.e., the same links 614) as data. Moreover, communication of commands: may have a lower data rate than the data rates associated with communication of data between the memory controller 610 and one or more of the memory devices 612; may use different carrier frequencies than are used to communicate data; and/or may use a different modulation technique than is used to communicate data.

Note that in some embodiments the memory controller 610 and/or one or more of the memory device 612 may use additional techniques to recover or prevent the loss of data communicated between components in the memory system 600 and/or the loss of stored data. For example, at least a portion of the data communicated between the components and/or the stored data may include error-detection-code (EDC) information and/or error-correction-code (ECC) information. This EDC and/or ECC information may be pre-existing or may be dynamically generated (e.g., in real time).

In some embodiments, the ECC information includes a Bose-Chaudhuri-Hocquenghem (BCH) code. Note that BCH codes are a sub-class of cyclic codes. In exemplary embodiments, the ECC information includes: a cyclic redundancy code (CRC), a parity code, a Hamming code, a Reed-Solomon code, and/or another error checking and correction code.

Consequently, in some embodiments the receive circuits implement error detection and/or correction. For example, errors associated with communication may be detected by performing a multi-bit XOR operation in conjunction with one or more parity bits in the signals.

Moreover, as discussed previously in FIGS. 1-2, control logic 620 in the memory controller 610 and/or one or more of the memory device 612 may take a variety of remedial actions in the event of an error or a degradation of one or more of the performance metrics during communication between the memory controller 610 and one or more of the memory devices 612. These remedial actions may include: re-transmitting previous data; transmitting previous or new data (henceforth referred to as data) using an increased transmission power than the transmission power used in a previous transmission; reducing the data rate in one or more of the sub-channels relative to the data rate used in a previous transmission; transmitting data with reduced intersymbol interference (for example, with blank intervals inserted before and/or after the data); adjusting a period of the one or more timing signals; adjusting a skew or delay of the one or more timing signals; transmitting data at a single clock edge (as opposed to dual-data-rate transmission); transmitting data with at least a portion of the data including ECC or EDC; transmitting data using a different encoding or modulation code than the encoding used in a previous transmission; transmitting data after a pre-determined idle time; transmitting data to a different receive circuit; and/or changing the number of sub-channels. Note that in some embodiments one or more of these adjustments are performed: continuously; as needed (for example, based on one or more of the performance metrics); and/or after a pre-determined time interval.

In some embodiments, the remedial action (and more generally adjustments to one or more of the sub-channels) is based on control information that is exchanged between the memory controller 610 and one or more of the memory devices 612. This control information may be exchanged using in-band communication (e.g., via the frequency bands used to communicate the signals corresponding to the data) and/or out-of-band communication (e.g., using the separate link).

In some embodiments, the remedial action and/or adjustments involve an auto-negotiation technique. During this auto-negotiation technique, a receive circuit in one of the components (such as the memory controller 610) may provide feedback to a transmit circuit in another component (such as memory device 612-1) on the efficacy of any changes to the signals on a given sub-channel. Based on this feedback, the transmit circuit may further modify these signals, e.g., may perform the remedial action.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level RTL languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
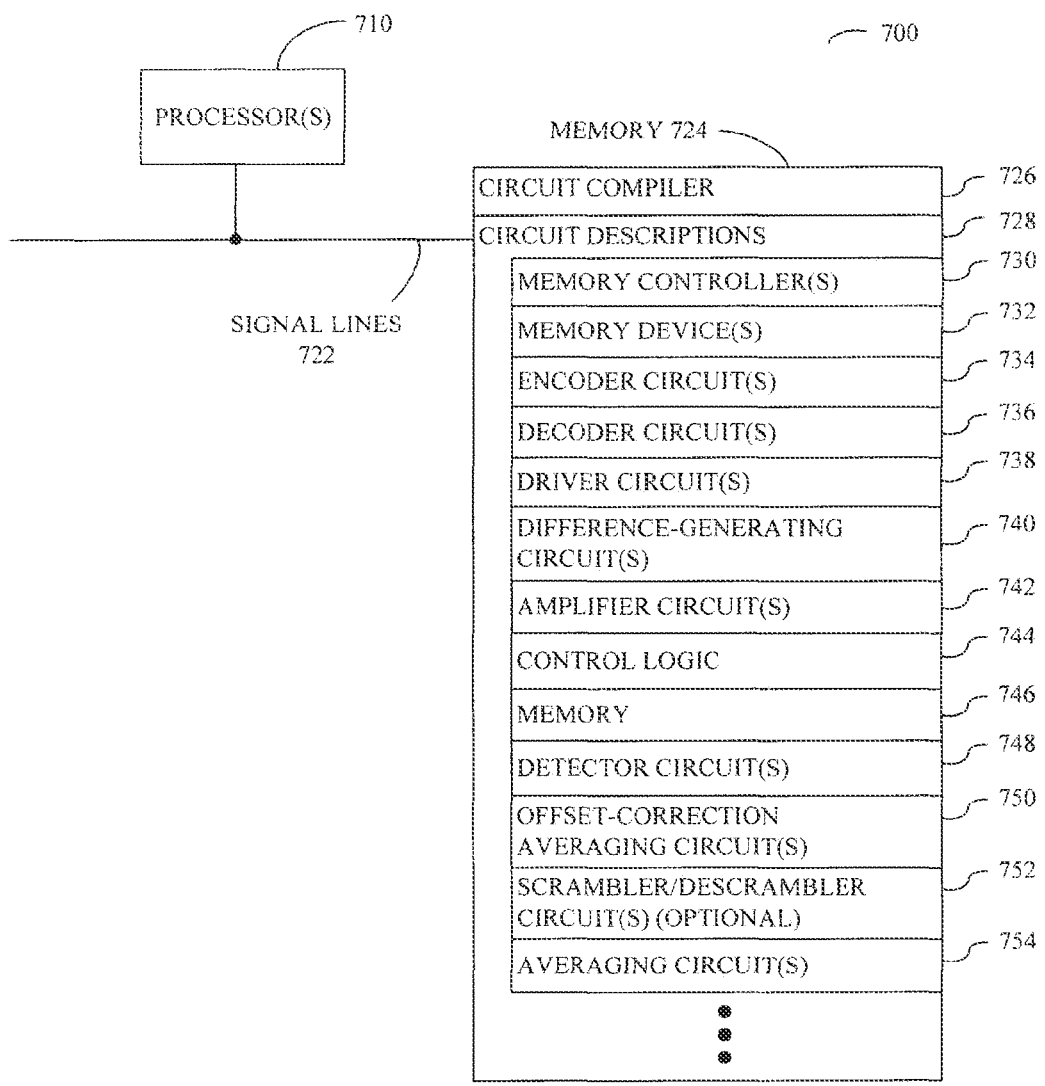
FIG. 7 is a block diagram illustrating an embodiment of a system.

FIG. 7 presents a block diagram illustrating an embodiment of a system 700 that stores such computer-readable files. This system may include at least one data processor or central processing unit (CPU) 710, memory 724 and one or more signal lines or communication busses 722 for coupling these components to one another. Memory 724 may include high-speed random access memory and/or non-volatile memory, such as: ROM, RAM, EPROM, EEPROM, flash, one or more smart cards, one or more magnetic disc storage devices, and/or one or more optical storage devices.

Memory 724 may store a circuit compiler 726 and circuit descriptions 728. Circuit descriptions 728 may include descriptions of the circuits, or a subset of the circuits discussed above with respect to FIGS. 1-4. In particular, circuit descriptions 728 may include circuit descriptions of: one or more memory controllers 730, one or more memory devices 732, one or more encoders 734, one or more decoders 736, one or more driver circuits 738, one or more difference-generating circuits 740, one or more amplifier circuits 742, control logic 744 (or a set of instructions), memory or a buffer 746, one or more detector circuits 748, one or more offset-correction averaging circuits 750, one or more scrambler/descrambler circuits 752, and/or one or more averaging circuits 754.

In some embodiments, system 700 includes fewer or additional components. Moreover, two or more components can be combined into a single component, and/or a position of one or more components may be changed.

While the preceding embodiments have used inter-chip or inter-device communication as an illustrative example, in other embodiments the N-M encoding and communication techniques may be used in conjunction with multi-wire, intra-chip or intra-device communication. For example, such communication may occur between components in a given integrated circuit.

In some embodiments, a first circuit includes a first receive circuit. This first receive circuit may include M input nodes that receive a set of M symbols on M links during a time interval, where the set of M symbols are associated with a codeword. Moreover, the first receive circuit includes a decoder, coupled to the M input nodes, that determines the codeword in a code space based on the set of M symbols and that decodes the codeword to a corresponding set of N decoded symbols. Additionally, the first receive circuit may include a detector that detects an imbalance in a number of instances of a first value in the set of M symbols and a number of instances of a second value in the set of M symbols, and, if an imbalance is detected, that asserts an error condition.

In some embodiments, the first receive circuit includes at least M sense amplifiers, where a given sense amplifier is coupled to at least given input node and the detector. Note that the M sense amplifiers may include single-ended amplifiers and/or differential amplifiers. Moreover, the M sense amplifiers may compare received symbols associated with all pairings of the M input nodes.

In some embodiments, at least some of the M links are configured for bidirectional communication. For example, at least some of the M links may communicate information to the first receive circuit and from the first receive circuit at different times.

Note that the imbalance may be detected via digital and/or analog circuits.

In some embodiments, the first receive circuit includes control logic that performs remedial action if an error condition is asserted. This remedial action may include communicating the error condition in the set of M symbols to a second circuit. For example, the error condition may be communicated to the second circuit during a read operation, in which the first circuit communicates data to the second circuit.

In some embodiments, the time of the error condition is communicated to the second circuit. Moreover, in some embodiments the set of M symbols that have the error condition is communicated to the second circuit. Additionally or separately, in some embodiments one or more symbols in the set of M symbols that are associated with the error condition are communicated to the second circuit.

Note that the error condition may be communicated to the second circuit via the M links. Alternatively, the error condition may be communicated to the second circuit via a separate channel than the M links.

In some embodiments, the remedial action includes correcting an error in one or more symbols in the set of M symbols. Moreover, in some embodiments the remedial action includes disabling a write operation, during which data communicated from the second circuit is stored to the first circuit, if a code space associated with the codeword includes at least another codeword associated with a write mask.

In some embodiments, the remedial action includes storing information about one or more links that are associated with the error condition.

In some embodiments, symbols in the set of M symbols have binary values. Moreover, in some embodiments the number of instances of the first value in the set of M symbols equals the number of instances of the second value.

Note that the first circuit may communicate information during inter-chip and/or intra-chip communication.

Another embodiment provides a first integrated circuit that includes the first circuit.

Another embodiment provides a first system that includes the first circuit and/or the first receive circuit.

Another embodiment provides a computer-readable medium that includes data that specifies the first circuit.

Another embodiment provides a first method for communicating information, which may be performed by a device (such as a memory device and/or a memory controller). During operation, the device receives a set of M received symbols on M links during a time interval, where the set of M symbols are associated with a codeword. Next, device determines the codeword in a code space based on the set of M symbols and decodes the codeword to a corresponding set of N decoded symbols. Then, the device detects an imbalance in a number of instances of a first value in the set of M symbols and a number of instances of a second value in the set of M symbols. Then, the device asserts an error condition if an imbalance is detected.

Another embodiment provides the second circuit, which includes a second receive circuit. This second receive circuit may receive information about an error condition from another circuit, such as the first circuit. Moreover, the second circuit may include a buffer that stores write data, associated with write operations, that has been communicated to the first circuit. Additionally the second circuit may include a transmit circuit, which includes: an encoder that encodes a set of N decoded symbols, received during a time interval, as a set of M symbols based on a given codeword in a code space, and that outputs the set of M symbols; and driver circuits, coupled to the encoder, that output the set of M symbols in the given codeword on M links to the second circuit, where a given symbol is output on a given link. Note that control logic in the second circuit, which is coupled to the receive circuit, the buffer and the transmit circuit, instructs the buffer to provide at least a portion of the write data, which is associated with the error condition, to the transmit circuit to be encoded and retransmitted to the first circuit.

In some embodiments, the information is received on at least a subset of the M links. Alternatively, the information may be received via a separate channel than the M links.

In some embodiments, the information is received during a read operation, in which the second circuit receives read data from the first circuit.

In some embodiments, at least the portion of the write data includes write data communicated to the first circuit since a previous read operation, in which the second circuit received read data from the first circuit.

In some embodiments, the information includes a time when the error condition occurred.

In some embodiments, the information includes a received set of M symbols, which were received at the first circuit, that have the error condition. Additionally or separately, in some embodiments the information includes one or more symbols in a received set of M symbols, which were received at the first circuit, that are associated with the error condition.

Note that the error condition may be associated with an imbalance in a number of instances of a first value in a received set of M symbols, which were received at the first circuit, and a number of instances of a second value in the received set of M symbols.

In some embodiments, symbols in the set of M symbols have binary values. Moreover, a number of instances of the first value in the set of M symbols may equal a number of instances of the second value.

Note that the second circuit may communicate information during inter-chip and/or intra-chip communication.

In some embodiments, the control logic communicates instructions for a read operation to the first circuit if a time interval has passed since a previous read operation.

Note that the second circuit receives read data from the first circuit during a given read operation.

In some embodiments, the control logic stores additional information about one or more links that are associated with the error condition.

Note that the driver circuits may include single-ended drivers.

In some embodiments, the encoded symbols are selected from a set of $2^N$ symbols in a space of $2^M$ possible symbols.

For example, N may be a positive number and/or M may be a positive integer. In some embodiments, N is less than M, and M is less than 2N.

In some embodiments, the second circuit includes a memory controller.

Another embodiment provides a second integrated circuit that includes the second circuit.

Another embodiment provides a second system that includes the second circuit and/or the second receive circuit.

Another embodiment provides a computer-readable medium that includes data that specifies the second circuit.

Another embodiment provides a second method for communicating information, which may be performed by a device (such as a memory controller and/or a memory device). During operation, the device receives, at a circuit (such as the second circuit), information about an error condition from another circuit (such as the first circuit). Next, the device instructs a buffer to provide at least a portion of write data, which is associated with write operations, that has been communicated to the first circuit, and which is associated with the error condition, for retransmission to the first circuit. Then, the device encodes a set of N decoded symbols in at least the portion of the write data as a set of M symbols based on a given codeword in a code space, and outputs the set of M symbols on M links to the first circuit.

Another embodiment provides a third circuit, which includes M input nodes that receive a set of M symbols on M links during a given time interval, where the set of M symbols are associated with a given codeword in a code space. Moreover, the third circuit includes at least M difference-generating circuits, where a given difference-generating circuit is coupled to a given pair of the input nodes, and an offset-correction averaging circuit which is at least selectively coupled to a given difference-generating circuit during the given time interval. Note that the offset-correction averaging circuit monitors an output from the given difference-generating circuit associated with different codewords during multiple time intervals, in which the inputs to the given difference-generating circuit are substantially the same. Additionally, the offset-correction averaging circuit updates an offset correction for the given difference-generating circuit based on the output.

In some embodiments, at least the M difference-generating circuits include differential amplifiers.

In some embodiments, the offset correction is based on an average, over time, of the output.

In some embodiments, the third circuit includes control logic that selectively couples the given difference-generating circuit to the offset-correction averaging circuit. For example, the control logic may selectively couple each of at least the M difference-generating circuits to the offset-correction averaging circuit during a sequence of time intervals.

In some embodiments, a current offset correction for the given difference-generating circuit is stored in a register and, during the update, the stored offset correction is revised.

In some embodiments, the offset correction for the given difference-generating circuit is updated by applying an analog signal to a terminal coupled to the given difference-generating circuit. Note that the terminal may be included in a storage device. Moreover, note that the storage device may include a capacitor.

In some embodiments, the given codeword includes an equal number of instances of a first value and a number of instances of a second value.

In some embodiments, at least the M difference-generating circuits have binary outputs. Note that the offset compensation may be based on a deviation from an expected number of instances of a first value in the output and a number of instances of a second value in the output during the multiple time intervals.

In some embodiments, the offset-correction averaging circuit separately monitors the output from the given difference-generating circuit when the inputs each have substantially a first value and when the inputs each have substantially a second value. Note that the offset compensation may be based on both the monitored output when the inputs each have substantially the first value and the monitored output when the inputs each have substantially the second value.

In some embodiments, the offset compensation is based on a deviation from an expected number of instances of a first value in the output and a number of instances of a second value in the output during the multiple time intervals in the output when the inputs each have substantially the first value or the output when the inputs each have substantially the second value. Moreover, in some embodiments the output when the inputs each have substantially the first value and the output when the inputs each have substantially the second value are combined to determine the offset compensation.

In some embodiments, codewords during a sequence of time intervals are scrambled so that at least the M difference-generating circuits have an equal number of occurrences where their inputs are the same during the sequence of time intervals. Moreover, the third circuit may include a descrambler to restore an original order of the codewords during the sequence of time intervals.

Note that the offset compensation may be determined in a normal operation mode and/or a calibration operation mode. When offset compensation is determined in a normal operation mode the individual code words may have voltages assigned to +/− inputs that are substantially the same to allow for continuous updating of offset values during normal operation with data transmission.

In some embodiments, the at least M difference-generating amplifiers compare received symbols associated with all pairings of the M input nodes.

In some embodiments, the third circuit includes a decoder, coupled to at least the M difference-generating amplifiers, that determines the given codeword in the code space based on outputs from at least the M difference-generating amplifiers and that decodes the given codeword to a corresponding set of N decoded symbols.

Note that the third circuit may communicate information during inter-chip and/or intra-chip communication.

Another embodiment provides a third integrated circuit that includes the third circuit.

Another embodiment provides a third system that includes the third circuit.

Another embodiment provides a computer-readable medium that includes data that specifies the third circuit.

Another embodiment provides a third method for communicating information, which may be performed by a device. During operation, the device receives a set of M symbols on M links during a given time interval, where the set of M symbols are associated with a given codeword in a code space. Next, the device generates at least M difference signals via at least M difference-generating circuits, where a given difference signal is based on symbols received on a given pair of links. Then, the device determines an offset correction for a given difference-generating circuit during the given time interval, where received symbols on inputs to the given difference-generating circuit are substantially the same. Moreover, the device updates the offset correction for the given difference-generating circuit.

The preceding description has been presented to enable any person skilled in the art to make and use the disclosed embodiments, and was provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Moreover, the foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A circuit to be coupled to a plurality of links including M links, the circuit comprising a receive circuit, wherein the receive circuit includes:
   M input nodes to receive M input signals from the M links during a time interval, wherein the M input signals represent a set of M symbols associated with a codeword;
   at least M difference-generating circuits to generate a set of difference signals based on the M input signals, wherein a given difference-generating circuit is coupled to a given pair of the input nodes;
   a decoder, coupled to the at least M difference-generating circuits, to determine the set of M symbols based on the set of set of difference signals, and to decode the codeword associated with the set of M symbols to a corresponding set of N decoded symbols;
   a detector to detect a difference in a number of instances of a first value in the set of M symbols and a number of instances of a second value in the set of M symbols, and to assert an error condition in response to the difference being detected;
   control logic, coupled to the detector, to perform remedial action if the error condition is asserted;
   register circuitry; and
   wherein the remedial action includes storing information about one or more links that are associated with the error condition in the register circuitry.

2. The circuit of claim 1, wherein the M difference-generating circuits include at least M sense amplifiers, wherein a given sense amplifier is coupled to at least one input node and the detector.

3. The circuit of claim 2, wherein the M sense amplifiers include single-ended amplifiers or differential amplifiers.

4. The circuit of claim 2, wherein the M sense amplifiers compare received input signals associated with all pairings of the M input nodes.

5. The circuit of claim 2, wherein the circuit receives the M input signals from the M links at a different time from when the circuit transmits information on the M links.

6. The circuit of claim 1, wherein the remedial action includes communicating the error condition to another circuit.

7. The circuit of claim 6, wherein the error condition is communicated to the other circuit during a read operation in which the circuit communicates data to the other circuit.

8. The circuit of claim 6, wherein a time of the error condition is communicated to the other circuit.

9. The circuit of claim 6, wherein at least a portion of the set of M symbols that have the error condition is communicated to the other circuit.

10. The circuit of claim 6, wherein the error condition is communicated to the other circuit via the M links.

11. The circuit of claim 6, wherein the error condition is communicated to the other circuit via a separate channel that is excluded from the M links.

12. The circuit of claim 1, wherein the remedial action includes correcting an error in one or more symbols in the set of M symbols.

13. The circuit of claim 1, wherein the remedial action includes disabling a write operation, during which data communicated from the other circuit is to be stored in the circuit, if a set of codewords associated with an encoding technique, which include the codeword, include at least another codeword associated with a write mask.

14. The circuit of claim 1, wherein the circuit includes an offset-correction averaging circuit to be at least selectively coupled to a given difference-generating circuit during multiple time intervals in which the input signals to the given difference-generating circuit are substantially the same; and
wherein the offset-correction averaging circuit is to monitor an output from the given difference-generating circuit during the multiple time intervals, and is to update an offset correction for the given difference-generating circuit based on the output.

15. The circuit of claim 14, wherein the circuit includes a register to store an offset correction for the given difference-generating circuit, which is to be revised during the update.

16. The circuit of claim 14, wherein the offset correction for the given difference-generating circuit is updated by applying an analog signal to a terminal coupled to the given difference-generating circuit.

17. The circuit of claim 16, wherein the M difference-generating circuits have binary outputs; and
wherein the offset correction is based on a deviation from an expected number of instances of the first value in the output and an expected number of instances of the second value in the output during the multiple time intervals.

18. A method for communicating information, comprising:
receiving a set of M input signals on M links during a time interval, wherein the M input signals represent a set of M symbols associated with a codeword;
determining a set of difference signals based on the set of M input signals using at least M difference-generating circuits, wherein a given difference-generating circuit is coupled to a given pair of input nodes;
determining the codeword in a set of codewords associated with an encoding technique that encoded the codeword based on the set of difference signals, and decoding the codeword to a corresponding set of N decoded symbols;
detecting a difference in a number of instances of a first value in the set of M symbols and a number of instances of a second value in the set of M symbols;
in response to the difference being detected, asserting an error condition; and
performing remedial action in response to the error condition being asserted, wherein the remedial action includes storing information about one or more links that are associated with the error condition in a register circuit.

19. The method of claim 18, wherein the set of difference signals correspond to all pairings of the M input signals.

20. The method of claim 18, wherein the method further comprises performing remedial action if the error condition is asserted.

21. The method of claim 18, wherein the method further comprises:
selectively coupling an offset-correction averaging circuit to a given difference-generating circuit during multiple time intervals in which the input signals to the given difference-generating circuit are substantially the same;
monitor an output from the given difference-generating circuit during the multiple time intervals using the offset-correction averaging circuit; and
updating an offset correction for the given difference-generating circuit based on the output.

22. A system, comprising:
a transmit circuit, having M output nodes, to provide a set of M signals during a time interval, wherein the M signals represent a set of M symbols associated with a codeword;
M links coupled to the M output nodes, wherein a given link is coupled to a given output node; and
a receive circuit, wherein the receive circuit includes:
M input nodes to receive the M signals from the M links during the time interval;
at least M difference-generating circuits to generate a set of difference signals based on the M signals, wherein a given difference-generating circuit is coupled to a given pair of the input nodes;
a decoder, coupled to the at least M difference-generating circuits, to determine the set of M symbols based on the set of set of difference signals, and to decode the codeword associated with the set of M symbols to a corresponding set of N decoded symbols; and
a detector to detect a difference in a number of instances of a first value in the set of M symbols and a number of instances of a second value in the set of M symbols, and to assert an error condition in response to the difference being detected;
control logic, coupled to the detector, to perform remedial action if the error condition is asserted;
register circuitry; and
wherein the remedial action includes storing information about one or more links that are associated with the error condition in the register circuitry.

\* \* \* \* \*